US006169412B1

(12) United States Patent
Byers

(10) Patent No.: US 6,169,412 B1
(45) Date of Patent: Jan. 2, 2001

(54) ADJUSTABLE TOOLING PIN FOR A CARD TEST FIXTURE

(75) Inventor: Rodger A. Byers, Cabarrus County, NC (US)

(73) Assignee: International Business Machines Corporation, Armonk, NY (US)

( * ) Notice: Under 35 U.S.C. 154(b), the term of this patent shall be extended for 0 days.

(21) Appl. No.: 09/224,959

(22) Filed: Jan. 4, 1999

Related U.S. Application Data

(62) Division of application No. 08/653,215, filed on May 24, 1996, now Pat. No. 5,892,366.

(51) Int. Cl.$^7$ .................................................. G01R 1/073
(52) U.S. Cl. ............................................ 324/758; 324/761
(58) Field of Search ...................................... 324/758, 754, 324/755, 761, 158.1

(56) References Cited

U.S. PATENT DOCUMENTS

| 4,667,155 | 5/1987 | Coiner et al. | 324/754 |
|---|---|---|---|
| 4,857,838 | * 8/1989 | Willberg | 324/758 |
| 5,153,505 | 10/1992 | Abita et al. | 324/758 |
| 5,300,881 | 4/1994 | Ferrer et al. | 324/754 |
| 5,311,119 | 5/1994 | Bullock et al. | 324/754 |
| 5,311,120 | 5/1994 | Bartholomew | 324/754 |
| 5,408,189 | 4/1995 | Swart et al. | 324/758 |
| 5,642,056 | * 6/1997 | Nakajima et al. | 324/758 |
| 5,648,729 | * 7/1997 | Yamauchi et al. | 324/158.1 |

FOREIGN PATENT DOCUMENTS 52347    7/1976   (SU).

* cited by examiner

Primary Examiner—Ernest Karlsen
(74) Attorney, Agent, or Firm—McGuire Woods; Lawrence R. Fraley, E

(57) ABSTRACT

An adjustable tooling pin for a bed-of-nails test fixture used for testing circuit boards (cards) is provided which allows the tooling pin, and thus the card, to be precisely realigned while the card is still mounted in the test fixture. The adjustable tooling pin mechanism comprises a pivot bushing having a channel running from end-to-end into which a slide bar fits. The tooling pin projects from the end of the sliding bar in the z-direction such that a card may be located over the tooling pin. A locking screw fits through an aperture in the sliding bar and the pivot bushing and is threadably engaged into a threaded insert in the test fixture top plate. Hence, the tooling pin, and thus the card, are radially adjustable in the x-y plane by turning the pivot bushing and by sliding the sliding bar along the pivot bushing channel. This adjustable tooling pin is especially beneficial for modern card technology which requires electronic card assemblies to be densely populated, with the test pads located on 25 mil (0.063 mm), 40 mil (0.101 mm) and 50 mil (0.127) drill centers, and test pad diameter of 0.020" (0.0508 mm).

4 Claims, 5 Drawing Sheets

ADJUSTABLE TOOLING PIN FOR A CARD TEST FIXTURE

This application is a division of application Ser. No. 08/653,215, filed on May 24, 1996, now U.S. Pat. No. 5,892,366.

BACKGROUND OF THE INVENTION

1. Field of the Invention

The present invention generally relates to test fixtures for circuit boards and, more particularly, to an adjustable tooling pin for positioning electronic circuit boards in a vacuum test fixture.

2. Description of the Prior Art

Circuit board designers are constantly faced with the challenge of packaging more and more electronics into a smaller amount of space. Often times, during the design process, circuit test pads must be relocated to other places on the board to make room for other functional components. Test pads are necessary on circuit boards to allow interconnection to test equipment via a test fixture. A test fixture is typically an automated device which comprises a plurality of fixed upwardly projecting spring-loaded test probes. This type of fixture is commonly referred to as a "bed-of-nails" test fixture. Each of the test probes in the bed correspond to a test pad on the circuit board such that when the board is pulled down on top of the probes, each probe is brought into electrical contact with its corresponding test pad.

FIG. 1 shows an example of a bed-of-nails test fixture for testing circuit boards (cards) generally referred to by the reference numeral 10. The test fixture 10 comprises a probe plate 12 having a plurality of upwardly projecting spring-loaded test probes 14 which resemble a bed-of-nails. Each of the test probes 14 correspond to a test pad 16 on the card 18 under test. The card 18 sits on blocks 20 above a rigid top plate 22. A tooling pin 24, fixed to top plate 22, fits into an alignment or tooling hole in the card 18 to provide alignment for the test probes 14 and the test pad 16. The guide plate must be made of a non-conductive material so as not to interfere with the electrical signals from the tester. When a vacuum chamber 28, sealed by a vacuum mat 30 and vacuum seal 32, is evacuated of air, atmospheric pressure pushes down on the vacuum mat 30 and top plate 22 compressing springs 26 and causing the top plate 22 to move in a downward direction along guide pin 34. A backer plate 36, connected to the guide plate 22, pushes down on backer post 38 which, in turn, pushes down on the circuit board 18 under test. Guide apertures 40 allow probe tips 42 to slide therethrough and make electrical contact with the test pad 16.

A drawback to the test fixture shown in FIG. 1 is the non-adjustable design of the tooling pins 24. This is a problem since card assembly processes constantly change the tooling pin locations. For example, heat from wave solder processes or heat created at card burn-in can change the tooling hole location. The tooling pins 24 must accurately locate the card under test 18 to spring loaded test probes 14 in the test fixture to make sure that each test probe makes good electrical contact to its corresponding test pad 16. This leads to particular alignment problems for test pads located on 25 mil (0.063 mm), 40 mil (0.101 mm) and 50 mil (0.127) drill centers since the tooling pins 24 are not adjustable.

There are two methods used for aligning the card 18 under test with the bed of test probes 14. The first method comprises physically changing the location of the tooling pin 24 by plugging the original tooling hole in the top plate 22 and redrilling at a new location. This effort may need to be repeated for each batch of cards where the test pads have changed to again realign the card 18 to the test probes 14. This particular method of alignment is time consuming and inefficient and can only be preformed a finite number of times before the top plate 22 has too many plugged holes to be useful.

The second method of realigning the card 18 under test with the bed-of-nails test probes 14 involves the use of a sophisticated optical alignment system with micrometer adjustments. However, this method is prohibitively expensive.

As technology drives the sizes of components and test pads down, it becomes increasingly important to have an accurately aligned tooling pin as well as a method for making minute and frequent adjustments at the tester itself while the product is undergoing test.

SUMMARY OF THE INVENTION

It is therefore an object of the present invention to provide an adjustable tooling pin for a circuit board test fixture which can easily and repeatedly change the position of the card under test relative to the probes.

It is yet another object of the present invention to provide an adjustable tooling pin which radially moves to any position in an area of the x-y plane over the top plate.

It is yet another object of the present invention to provide an apparatus and method for precisely locating the card under test to the test probes without taking the test fixture off-line, and without toolmaker involvement.

According to the invention, an adjustable tooling pin for a bed-of-nails test fixture which is used for testing circuit boards (cards) is provided. A card to be tested includes a plurality of test pads to be contacted by a corresponding plurality of test probes. The card to be tested is fixed by the adjustable tooling pin to a top plate having apertures therethrough aligned with the test pads. As the top plate is lowered over the test probes the probes pass through the apertures and contact the test pads. The adjustable tooling pin mechanism comprises a pivot bushing having a channel running from end-to-end into which a slide bar fits. The tooling pin projects from the end of the sliding bar in the z-direction such that a card may be installed over the tooling pin. A locking screw fits through an aperture in the sliding bar and the center of the pivot bushing and is threadably engaged into a threaded insert set in the test fixture top plate.

In operation, a card to be tested is installed over the tooling pin above the top plate. The tooling pin, and thus the card, is radially adjustable in the x-y plane by turning the pivot bushing and by sliding the sliding bar along the pivot bushing channel. Hence, the adjustable tooling pin mechanism of the present invention allows the tooling pin to be precisely realigned while the card is still mounted in the test fixture. This adjustable tooling pin is especially beneficial for modern card technology which requires electronic card assemblies to be densely populated, with the test pads located on 25 mil (0.063 mm), 40 mil (0.101 mm) and 50 mil (0.127 mm) drill centers, and test pad diameters of 0.020" (0.0508 mm) or less.

BRIEF DESCRIPTION OF THE DRAWINGS

The foregoing and other objects, aspects, and advantages will be better understood from the following detailed description of a preferred embodiment of the invention with reference to the drawings, in which.

DETAILED DESCRIPTION OF A PREFERRED EMBODIMENT OF THE INVENTION

Figure 2A:
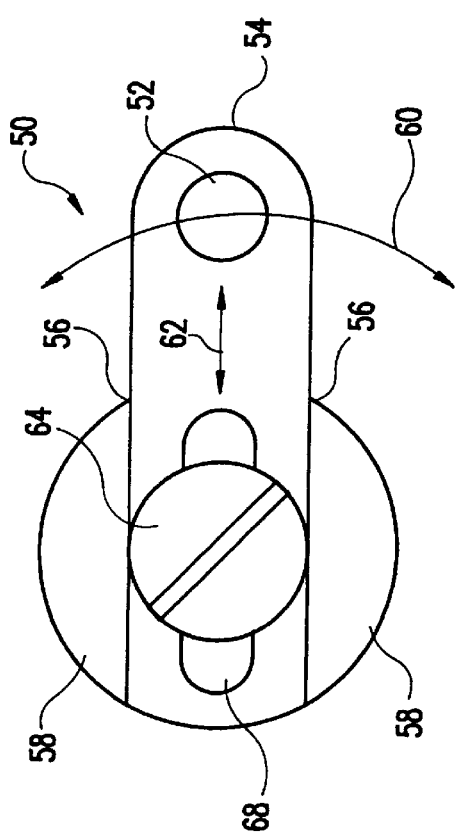
FIG. 2A is a top view of the adjustable pivot pin according to the present invention.

Referring now to the drawings, and more particularly to FIG. 2A, there is shown a top view of the adjustable tooling pin mechanism according to the present invention, generally referred to by the reference numeral 50. The adjustable tooling pin comprises a tooling pin 52 connected to one end of a sliding bar 54. The sliding bar 54 fits into a channel 56 cut through a pivot bushing 58. The pivot bushing 58 is rotatable so that the pivot pin 52 can be adjusted along arch 60. Additionally, the slide bar 54 can slide back and forth in channel 56 in the direction of arrow 62 thus allowing the tooling pin 52 to move in a radial direction in and out from the center of the pivot pin bushing 58. A locking screw 64 tightens down over the sliding arm 54 and the pivot bushing 58 to lock the tooling pin 54 in place.

Figure 1:
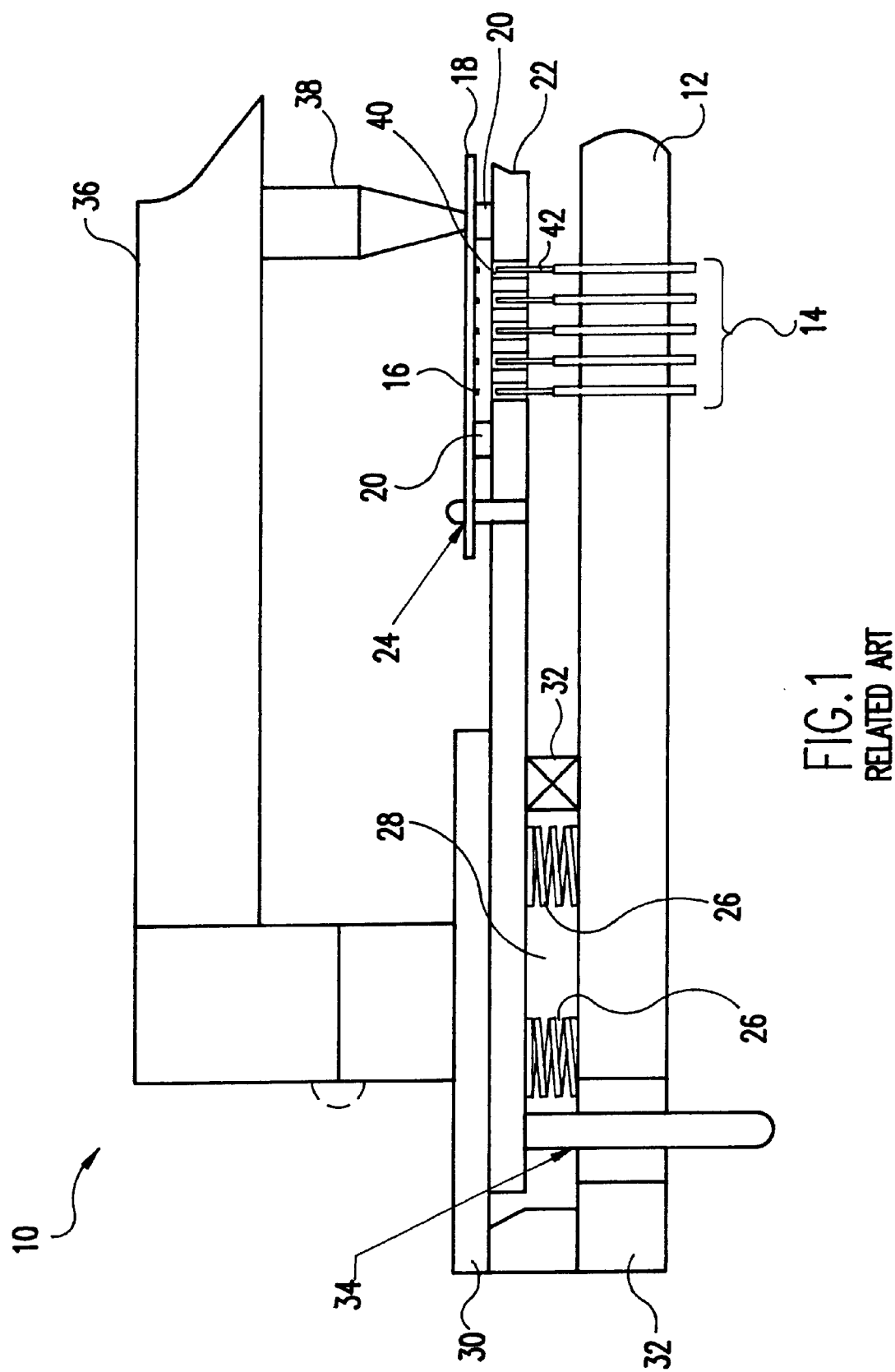
FIG. 1 is diagram showing a test fixture of the type which the adjustable tooling pin of the present invention may be used.
Figure 2B:
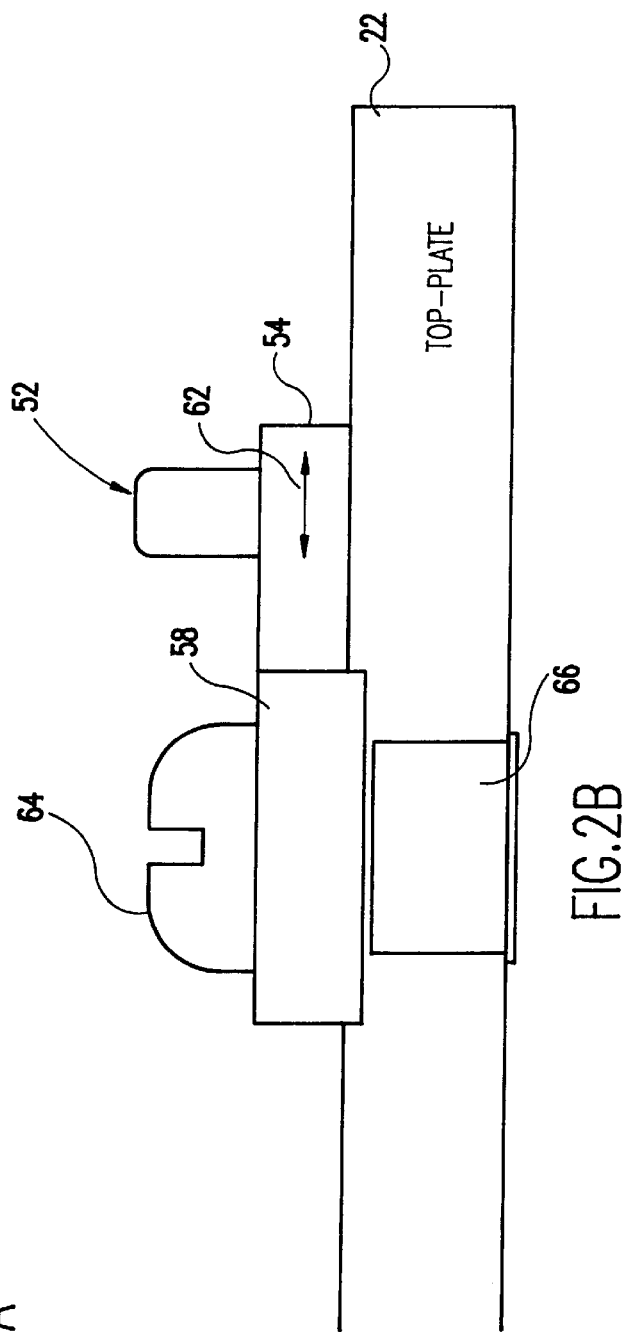
FIG. 2B is a side view of the adjustable pivot pin shown in FIG. 2A.

FIG. 2B is a side view of the adjustable tooling pin mechanism, as shown in FIG. 2A, attached to the top plate 18 of a tooling fixture, such as that shown in FIG. 1. A threaded sleeve insert 66 is secured in the top plate 22. When the locking screw 46 is turned into the threaded insert 66, the sliding arm 54, the pivot bushing 58, and thus the tooling pin 52, become locked with respect to the top plate 22. The position of the tooling pin 52 can be readily adjusted by unlocking the lock screw 64 and rotating the bushing 58 and/or sliding the slide bar 54 to move the tooling pin 52 to the new desired position and then re-tightening the lock screw 64.

Figure 3A:
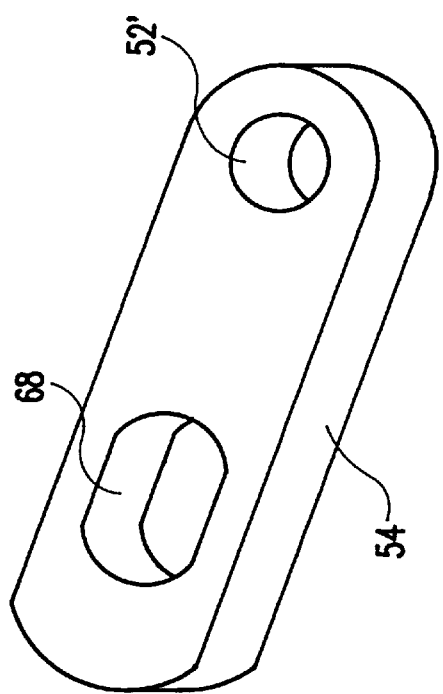
FIGS. 3A, 3B, and 3C, are isometric, top, and side views, respectively, of the slide bar according to the present invention.
Figure 3B:
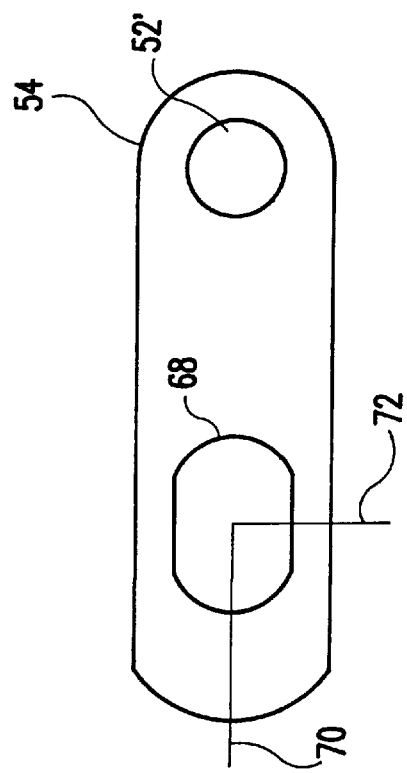
Figure 3C:
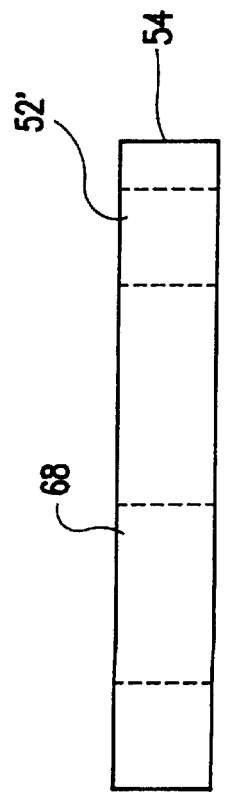

FIGS. 3A, 3B, and 3C, are isometric, top, and side views, respectively, of the slide bar 54 according to the present invention. An aperture 68 is formed in the slide bar 54. The aperture 68 has a larger diameter 70 along the length of the sliding arm 54 than the diameter across the width 72. The larger diameter 70 permits the sliding arm 54 to slide back and forth in the bushing channel 56 in the direction of arrow 62 when the locking screw is untightened. Similarly, a second aperture 52' is shown for engaging a tooling pin 52.

Figure 4A:
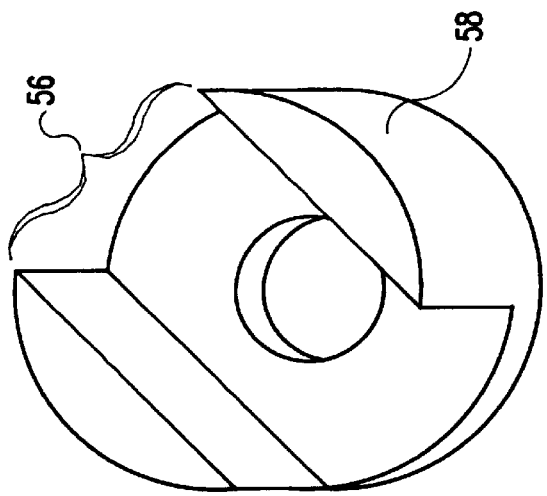
FIGS. 4A, 4B, and 4C are isometric, top, and side views, respectively, of the pivot bushing according to the present invention.
Figure 4B:
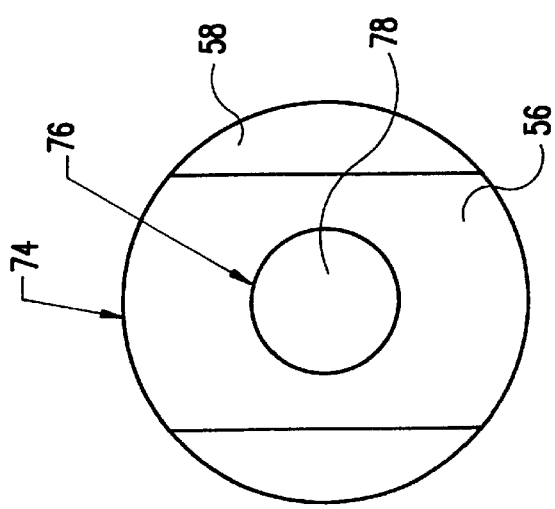
Figure 4C:
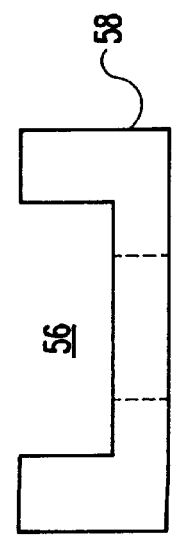

FIGS. 4A, 4B, and 4C are isometric, top, and side views, respectively, of the pivot bushing 58 according to the present invention. The pivot bushing is generally disc shaped having an outer radius 74 and an inner radius 76, the inner radius 76 defining an aperture 78 for allowing the locking screw 64 to pass therethrough. The channel 56 is cut through the pivot bushing 58 and is sized to accommodate the sliding bar 54 as shown in FIGS. 2A and 2B.

Figure 5:
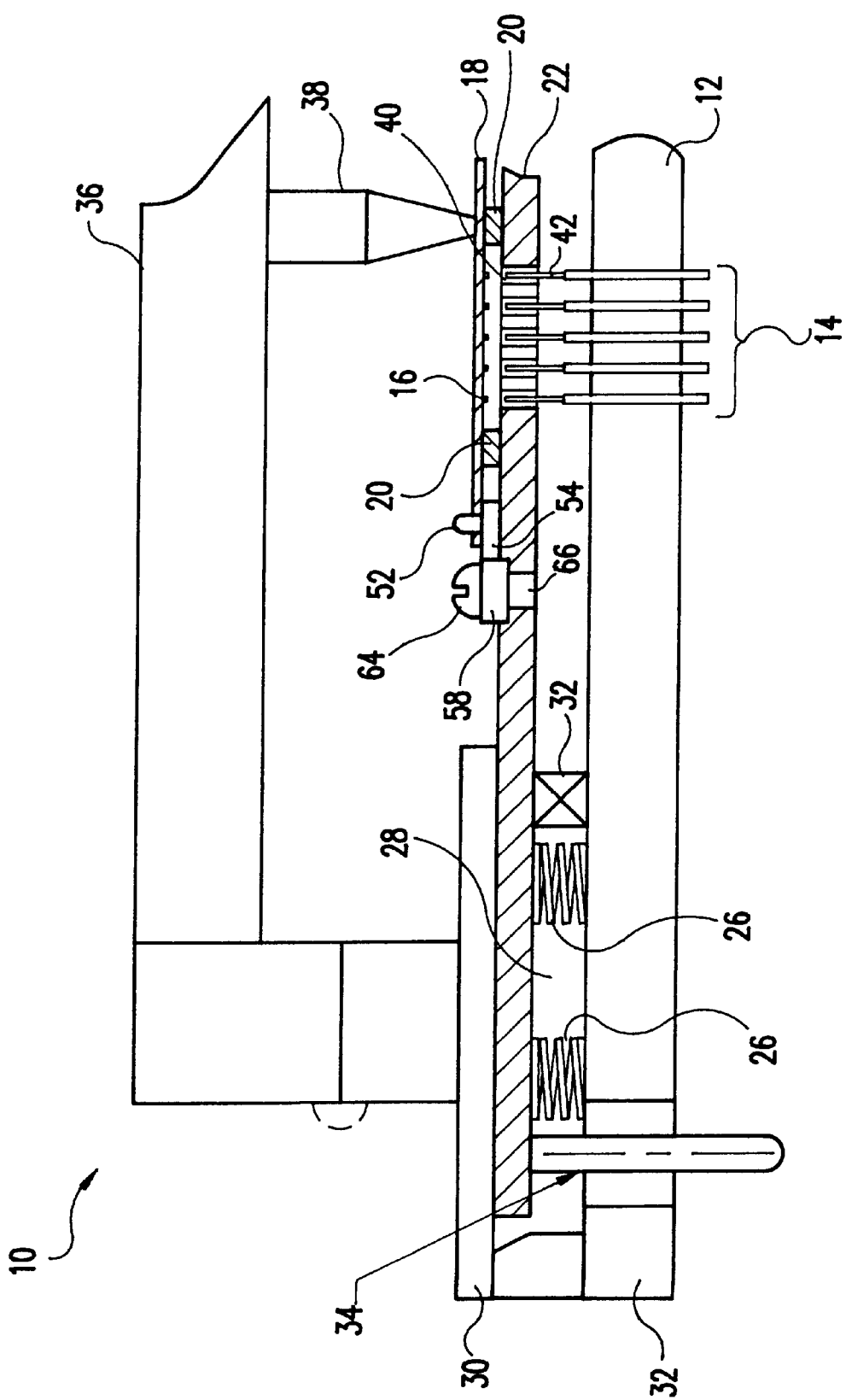
FIG. 5 is an automated test fixture apparatus having an adjustable tooling pin according to the present invention.

Hence, the present invention provides an apparatus and method for precisely locating a card under test to the test probes without taking the test fixture offline, and without toolmaker involvement, while the card remains in the test fixture. FIG. 5 shows an automated test fixture apparatus having an adjustable tooling pin 52 according to the present invention. Test fixture down time is reduced since the present invention allows alignment adjustments to be made with the card 18 mounted on the tester 10. Furthermore, with the adjustable tooling pin 52 of the present invention, more frequent adjustments are likely, which will reduce retest rates and improve test quality.

While the invention has been described in terms of a single preferred embodiment, those skilled in the art will recognize that the invention can be practiced with modification within the spirit and scope of the appended claims.

I claim:

1. A method of adjusting a position of a card in a test fixture, comprising the steps of:

attaching a card to at least one adjustable tooling pin;

moving said tooling pin in an arch pattern about a pivot point relative to at least one test probe, such that a test pad on the card is on a same radial line as said at least one test probe; and adjusting a radial distance of said tooling pin relative to said pivot point, such that the test pad on the card is aligned with said at least one test probe.

2. A method of adjusting a position of a card in a test fixture as recited in claim 1 further comprising the step of locking said test pin relative to said at least one test probe.

3. A method of adjusting a position of a card in a test fixture as recited in claim 1 wherein said step of moving said tooling pin in an arch motion comprises turning a pivot bushing.

4. A method of adjusting a position of a card in a test fixture as recited in claim 3 wherein said step of adjusting a radial distance of said tooling pin comprises sliding an arm mounted in a channel cut into said pivot bushing.

* * * * *